United States Patent [19]
Merrin

[11] 3,801,878
[45] Apr. 2, 1974

[54] GLASS SWITCHING DEVICE USING AN ION IMPERMEABLE GLASS ACTIVE LAYER

[75] Inventor: Seymour Merrin, Fairfield, Conn.

[73] Assignee: Innotech Corporation, Norwalk, Conn.

[22] Filed: Mar. 9, 1971

[21] Appl. No.: 122,302

[52] U.S. Cl. ..... 317/234 R, 317/234 V, 317/234 F, 317/234 S, 317/235 AG, 317/235 B, 317/235 K

[51] Int. Cl. .......................... H01l 3/00, H01l 11/14

[58] Field of Search ... 317/238, 234, 235 V, 234 V, 317/234 F, 234 S, 235 AG, 235 R, 234 R

[56] References Cited

UNITED STATES PATENTS

| | | | |
|---|---|---|---|
| 3,564,353 | 2/1971 | Corak et al. | 317/234 |
| 3,247,428 | 4/1966 | Perri et al. | 317/234 |
| 3,535,133 | 10/1970 | Akhtur | 106/53 |
| 3,676,756 | 7/1972 | Merrin | 317/235 |
| 3,699,543 | 10/1972 | Neale | 340/173 R |

*Primary Examiner*—Martin H. Edlow
*Attorney, Agent, or Firm*—Pennie & Edmonds

[57] ABSTRACT

A glass electronic switching device having improved long-term reliability comprises a thin layer of an ion impermeable glass disposed between a pair of electrical contacts. Preferably the glass is an insulating glass having a thermal coefficient of expansion compatible with typical crystalline semiconductors, and the glass layer typically has a thickness of less than about five microns. These glass switches can be readily incorporated into high-density integrated circuits using planar techniques. When sufficiently thin glass layers are used, the same glass layer which comprises the active layer of the switching device can also comprise a masking layer to facilitate the fabrication of conventional diffused junction devices, a dielectric layer for the fabrication of surface effect devices, and a passivating layer to protect an underlying crystalline semiconductor substrate.

11 Claims, 5 Drawing Figures

INVENTOR
Seymour Merrin
BY Pennie, Edmonds, Morton, Taylor & Adams
ATTORNEYS

GLASS SWITCHING DEVICE USING AN ION IMPERMEABLE GLASS ACTIVE LAYER

BACKGROUND OF THE INVENTION

The present invention relates to an electronic switching device which employs an active layer of an ion impermeable glass.

The term glass within the context of this description, includes those materials which typically exhibit only short-term ordering. It is intended to exclude the true crystalline substances which are the semiconductor materials commonly used in active electronic devices and the true amorphous materials which have no appreciable ordering. Glasses are typically quenched liquids having a viscosity in excess of about $10^8$ poise at ambient temperature. They are generally characterized by: (1) the existence of a single phase; (2) gradual softening and subsequent melting with increasing temperature, rather than sharp melting characteristics; (3) conchoidal fracture; and (4) the absence of crystalline X-ray diffraction peaks.

Because of the ease with which they can be fabricated, glass switching and memory devices offer considerable promise for a wide variety of applications in the electronic devices art. A typical glass switching device, such as that described by J. F. Dewald et al., in U. S. Pat. No. 3,241,009 issued Mar. 15, 1966, comprises a layer of a special composition "semiconducting" glass, such as As-Te-I, disposed between a pair of electrodes. In operation this device exhibits switching and memory capability. When an increasing voltage is applied across the layer, a high resistance is encountered until the voltage reaches a critical value $V_c$. Any additional increase in the voltage switches the glass into a high conducting state. The switching can occur in less than a microsecond and is reversible. The device remains in a given state, even under zero bias, and thus displays memory.

One of the factors which has thus far prevented full realization of the potential of these devices is insufficient long-term stability. (See, for example, J. D. Mackenzie, *Looking Through Glasses for New Active Components*, 39 Electronics 135, Sept. 19, 1966.) The current-voltage characteristics of the device tend to undergo irreversible changes with prolonged use. It is applicant's belief that these irreversible changes are due, at least in part, to the migration of impurity ions within the glass. (Similar irreversible changes in the characteristics of $SiO_2$ dielectric layers have already been attributed to the migration of sodium ions.)

Another factor which has limited the usefulness of these glass switching devices is that they are not well-suited for incorporation into integrated circuits. These devices have been typically conceived, fabricated, and utilized as discrete element circuit components. Moreover, they are typically ill-suited–both dimensionally and compositionally–for easy integration into circuits which also contain junction or field effect devices. For example, the planar technique for fabricating integrated circuits generally requires thin masking layers (typically having a thickness of two microns or less for high-component density integrated circuits) for facilitating the fabrication of diffused junction devices. In addition, it requires high quality dielectric layers (typically having a thickness of a micron or less) for use in capacitors and surface effect devices, and ion impermeable layers for passivating the underlying crystalline semiconductor substrate. The glass layers used in typical prior art glass switching devices, however, are not well-suited to perform any of these functions. They typically have a minimum thickness in excess of several microns thereby rendering them useless as masking layers; they typically have resistivities between $10^2$ and $10^{10}$ ohm-cm thereby reducing their value as dielectrics; and they are not sufficiently ion impermeable at elevated temperatures to provide high quality passivating layers. In addition, many of these glasses do not have coefficients of thermal expansion and contraction which are compatible with typical crystalline semiconductor substrates. Moreover, these glasses typically lack sufficient compositional stability at elevated temperatures to permit the use of conventional fabrication techniques. (See, for example, R. G. Neale et al., *Nonvolatile and Reprogramable, the Read Mostly Memory is Here*, in the Sept. 28, 1970 issue of Electronics, particularly at page 58.)

SUMMARY OF THE INVENTION

In accordance with the invention, a glass electronic switching device having improved long-term reliability comprises a thin layer of an ion impermeable glass disposed between a pair of electrical contacts. Preferably the glass is an insulating glass having a thermal coefficient of expansion compatible with typical crystalline semiconductors, and the glass layer has a thickness of less than about 5 microns. Such preferred glass switches can be readily incorporated into high-density integrated circuits using planar techniques. When sufficiently thin glass layers are used, the same glass layer which comprises the active layer of the switching device can also comprise a masking layer to facilitate the fabrication of conventional diffused junction devices, a dielectric layer for the fabrication of surface effect devices (such as IGFETS and bipolar transistors), and a passivating layer to protect an underlying crystalline semiconductor substrate.

BRIEF DESCRIPTION OF THE DRAWINGS

The advantages, nature, and various features of the present invention will appear more fully upon consideration of the illustrative embodiments now to be described in detail in connection with the accompanying drawings.

In the drawings.

DETAILED DESCRIPTION

Figures 1, 2, 3A, 3B, 3C:
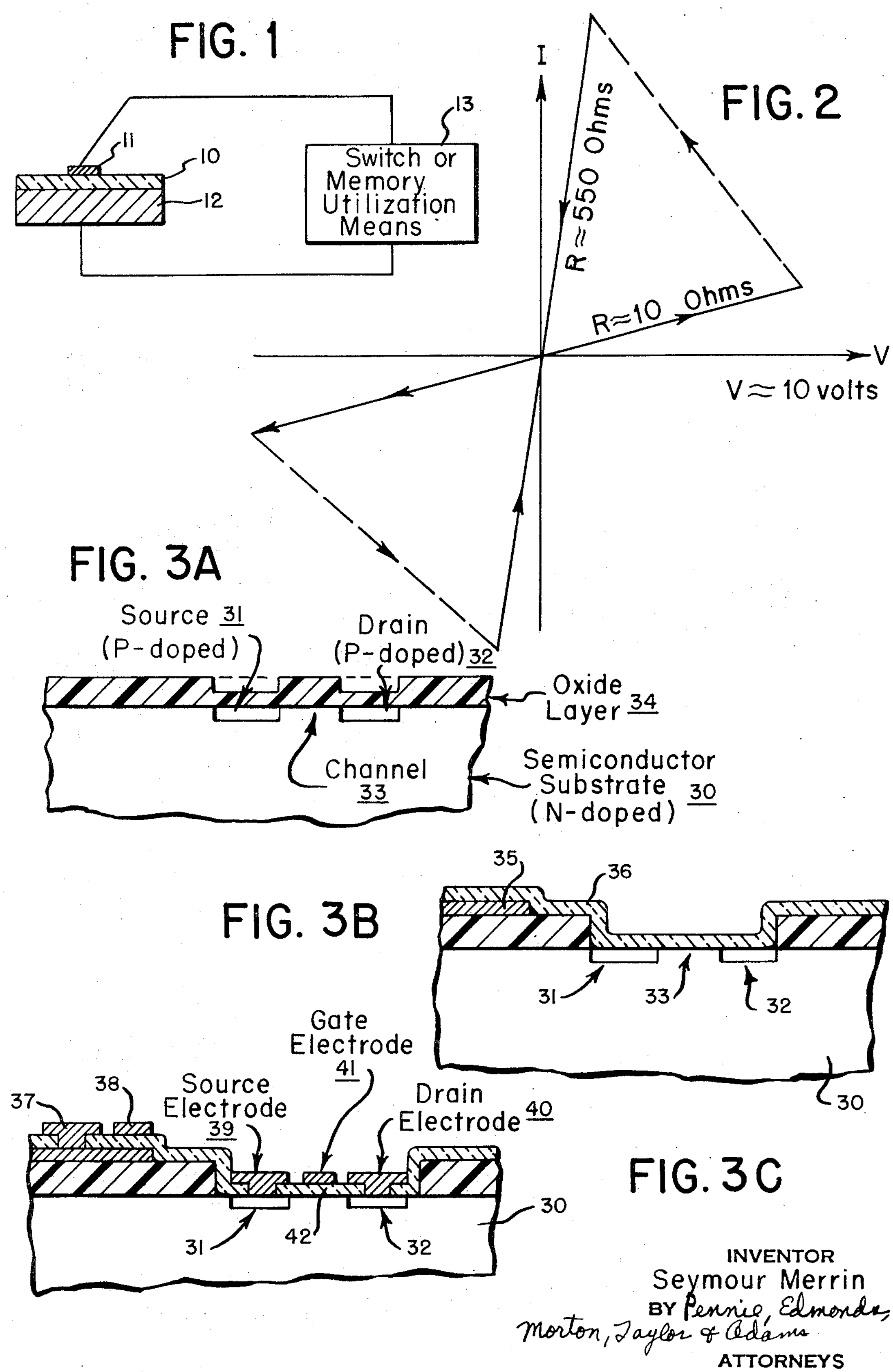
FIG. 1 is a schematic cross section of a glass switch (or memory device) in accordance with the invention.
FIG. 2 is a graphical illustration showing the current-voltage characteristic of a typical glass switch in accordance with the invention.
FIGS. 3A, 3B, and 3C show schematic cross sections of an integrated circuit including a glass switch, junctions, and surface-effect devices, at various stages in the fabrication.

Referring to the drawings, FIG. 1 is a schematic cross section of a glass electronic switching device employing an insulating ion impermeable glass in accordance with the invention. The device comprises, in essence, a layer 10 of an insulating ion impermeable glass which is sufficiently thin to exhibit a useful level of conduction disposed between a pair of contact electrodes 11 and 12. The electrodes, in turn, are connected to switch or memory utilization means 13. The switch or memory utilization means can comprise, for example, any one of the many known lumped elements or integrated circuits which normally utilize a switch or memory device in the electrical path between electrodes 11 and 12.

Glass layer 10 is of a substantially homogeneous glass having a composition which is ionically impermeable to ions of typical ambient materials. The glass is ion impermeable so that it remains stable over a wide range of operating conditions and over a prolonged period of operation. For this purpose, a glass layer may be defined as ionically impermeable if a capacitor using the layer as a dielectric does not show an appreciable shift in the room temperature capacitance-voltage characteristic after having been heated to the anticipated operating temperature in the presence of typical ambient materials and biased at the anticipated operating voltage for a period of 100 hours. The glass is homogeneous so that its properties are substantially uniform throughout the layer and so that devices having substantially the same characteristics are reproducible from at least the same batch of glass.

With regard to this requirement, it has been realized that because typical glass melts retain a degree of structure from the phases (compounds) from which they are formed, the glasses made predominantly from compositions of ionically impermeable crystalline phases will generally also be ionically impermeable. It has also been observed that phases which have as their main structural element a linear chain-like element, such as alkaline earth metasilicates, are generally ionically impermeable and cool to form ionically impermeable glasses. Typical common examples of such phases include $PbSiO_3$, $Pb_6Al_2Si_6O_{21}$, $ZnB_2O_4$, and $Zn_2SiO_4$. Glasses predominantly made up of mixtures of these phases are ionically impermeable. Generally, glasses comprising more than 50 mole per cent of such phases will be sufficiently good barriers to ionic contaminants to produce long lasting and reliable discrete switches. Glasses comprising 70 mole per cent or more are excellent barriers even in the thin films required for dielectrics in surface effect devices and high-component density integrated circuits. Such glasses are preferred for discrete switches and generally required for switches incorporated into integrated circuits.

Typically, additional components may be added to the phase in small quantities without destroying the impermeability of the resulting glass. For example, in silicate glasses, $Al_2O_3$ may typically be added to the glass in quantities up to 20 mole per cent or more to vary the softening temperature or coefficient of thermal expansion. As another example, $B_2O_3$, $V_2O_5$ or $P_2O_5$ can be added to the glass in quantities up to 20 mole per cent to vary the electronic conduction mechanism in the glass. These components fit into a silica site without significantly altering the glass structure.

Insulating ionically impermeable glasses, i.e., glasses having a specific resistivity at or above about $10^{12}$ ohm-cm are preferred because they have insulating properties at least comparable with $SiO_2$ (the specific resistivity of which is about $10^{16}$ ohm-cm). Such materials can typically be used in place of $SiO_2$ as passivating layers in conjunction with conventional crystalline semiconductor devices or integrated circuits. These materials are typically insulating glasses of the broad lead silicate family, i.e., the family including modified and unmodified lead silicates, and the broad zinc silicate family.

Especially preferred are insulating ionically impermeable glasses which are thermally compatible with typical crystalline semiconductor devices, that is, insulating glasses which have a temperature coefficient of expansion compatible with that of typical semiconductor substrates and have softening temperatures below the damage temperature of typical diffused junction semiconductor devices. In addition, the glass should be able to withstand the temperatures utilized in the fabrication of typical semiconductor devices (for example the 550° C. temperature required to alloy aluminum contacts to silicon). Glasses meeting these requirements are found, for example, in the more narrowly defined families of the lead-boro-alumino silicates, the zinc-boro silicates, and the zinc-boro-alumino silicates.

The glass layer 10 which typically has a thickness of less than 2 microns is typically deposited on one of the electrodes (used as a substrate) by conventional techniques such as, for example, sedimentation or RF sputtering. For sedimentation depositions, the oxide components of the preferred glass composition are listed in Table 1. Below each listed preferred percentage range is a range in brackets of acceptable percentages:

TABLE 1

| | Mole percent |
|---|---|
| $SiO_2$ | 6.6 |
| | (3-12) |
| ZnO | 55.3 |
| | (45-65) |
| PbO | 2.7 |
| | (0-6) |
| $B_2O_3$ | 34.5 |
| | (25-40) |
| $Al_2O_3$ | 1.0 |
| | (0-3) |

wherein calcium oxide, barium oxide, or strontium oxide or a mixture thereof can be substituted for ZnO in an amount up to 10 mole per cent.

An alternative and satisfactory composition for a glass for sedimentation deposition is given in Table 2:

TABLE 2

| | Mole percent |
|---|---|
| $SiO_2$ | 60 |
| | (55-65) |
| PbO | 35 |
| | (30-40) |
| $Al_2O_3$ | 5 |
| | (0-7) |

where $B_2O_3$, $V_2O_5$, or $P_2O_5$ or a mixture thereof can be substituted for $SiO_2$ and ZnO can be substituted for PbO, each substitution being limited to 20 mole per cent.

For RF sputtering deposition, the components for a preferred glass composition are listed in Table 3:

TABLE 3

| | Mole percent |
|---|---|
| $SiO_2$ | 43.15 |
| | (35-55) |
| PbO | 43.15 |
| | (35-60) |
| $Al_2O_3$ | 7.70 |
| | (0-20) |

where $B_2O_3$, $V_2O_5$, or $P_2O_5$ or a mixture thereof can be substituted for $SiO_2$ and ZnO can be substituted for PbO, each substitution limited to 20 mole per cent.

An alternative and satisfactory composition for a glass for either sedimentation or RF sputtering deposition is given in Table 4:

TABLE 4

| | Mole percent |
|---|---|
| $SiO_2$ | 10 (5–15) |
| ZnO | 55.5 (50–65) |
| $B_2O_3$ | 34.5 (25–35) |

where calcium oxide, barium oxide, strontium oxide or a mixture thereof can be substituted for ZnO in amounts up to 10 mole per cent, and PbO can be substituted for ZnO in amounts up to 20 mole per cent.

These glasses can be formed in reasonably homogeneous batches in accordance with conventional techniques well known in the art. (For preparing the glasses for sedimentation, see, for example, the technique described by W. A. Pliskin, in U. S. Pat. No. 3,212,921 issued on Oct. 19. 1965.)

If it is desired to make glass layer 10 of submicron thickness (as might be required, for example, where the glass is also used as a dielectric layer in adjacent surface effect devices), the centrifuging technique disclosed in applicant's copending application Ser. No. 859,012, filed Sept. 18, 1969, can be used to produce the thin glass layer.

The invention will now be more concretely illustrated by the following specific examples:

EXAMPLE 1

A one micron thick layer of a homogeneous lead silicate glass having oxide components of PbO and $SiO_2$ in the mole ratio of 1:1 and including about one per cent of $B_2O_3$ was deposited by sedimentation on a few thousand angstroms thick copper electrode (which, in turn, was disposed on a doped silicon conductive substrate). A few thousand angstroms thick layer of copper was then deposited on the glass in the form of a dot by the vacuum evaporation technique. This device exhibited the switching characteristic shown in FIG. 2 when voltage was applied between the copper electrodes. The device also exhibited memory capacity.

EXAMPLE 2

A three microns thick layer of a homogeneous lead silicate glass having oxide components of PbO and $SiO_2$ in the mole ratio of 1:1 and including a few mole per cent of $V_2O_5$ was deposited by sedimentation on a few thousand angstroms thick layer of chromium (disposed on a thick glass substrate). A few thousand angstroms thick layer of chromium was then deposited on the thin glass layer in the form of a dot by vacuum evaporation. This device also exhibited both switching and memory capability.

EXAMPLE 3

A submicron layer of a homogeneous lead-alumino silicate glass comprising oxide components of PbO, $Al_2O_3$ and $SiO_2$ was deposited on a chromium electrode disposed on doped silicon conductive substrate. A copper dot electrode was applied on the thin glass layer as described in Example 1. This device exhibited both switching and memory capacity.

FIGS. 3A, 3B, and 3C illustrate an integrated circuit including a glass switching device adjacent an insulated gate field effect transistor at various stages of its fabrication. In the circuit, the same glass layer that comprises the active glass layer of the switch is also used as the passivating layer to protect diffused junction devices and as a dielectric layer for a surface effect device. Thus, all these layers are of the same composition and substantially the same thickness. This circuit is described primarily to illustrate how conveniently glass switching devices according to the invention can be incorporated into an integrated circuit containing junction and surface effect devices.

The first step in fabricating this circuit involves forming the channel, the source and the drain of the IGFET by diffusing impurities into a semiconductor substrate. This diffusion is advantageously carried out by the well-known planar technique on a standard single crystal wafer of silicon or germanium. A large number of devices—including devices other than IGFET's—may thus be fabricated at the same time. The planar technique for producing IGFET's is well known and adequately described in the literature of the art. In essence, it involves lightly doping a semiconductor substrate with one type of impurity, e.g., N-type, epitaxially growing a layer of oxide on the doped substrate, selectively etching holes in the oxide where the source and the drain are to be formed, and diffusing impurities of the type opposite those previously used into the exposed substrate through the holes in the oxide mask. The diffusion depth, impurity concentrations, and channel width can be carefully controlled to obtain the desired transistor characteristics in accordance with principles well known in the art. FIG. 3A shows a portion of a wafer including an IGFET at this state of fabrication comprising an N-doped substrate 30, such as silicon doped with phosphorus, a source 31 and drain 32 formed by diffusing an acceptor impurity such as boron into the N-doped substrate. The source and the drain are separated by a channel region 33. An oxide layer 34—the remnant of an earlier diffusion mask—is shown disposed upon the substrate.

The next step involves forming, by any of the techniques well known in the art, the base electrode 35 for the switch. Preferably, this electrode comprises a few thousand angstroms of a conductive metal such as copper or chromium.

The third step is exposing the semiconductor substrate above the source, drain and channel by removing any of the remaining masking layer disposed thereupon. Silicon dioxide, for example, can be removed by etching the wafer in hydrofluoric acid.

The next step involves depositing a layer 36 of glass for forming the active glass layer of the switch, the gate insulator and a passivating layer. The resulting structure is shown in FIG. 3B. In addition to being impermeable to the migration of ionic contaminants, the glass film should have a temperature coefficient of expansion compatible with the semiconductor so that the glass is not cracked by differential thermal expansion and contraction. For ease of fabrication, the glass film should have a softening temperature lower than the temperature at which diffused semiconductor devices will be damaged, i.e., typically less than 1,000° C.

Because of their high dielectric constants, these glasses must be formed into extremely thin pinhole-free films, typically less than 3,000 angstroms thick, in order to be useful as gate insulators. Such thin films may be formed in the manner described in applicant's aforementioned copending application. The gate insulator is then defined by etching through glass film 36 to expose the source and the drain.

After the gate insulator is defined, metal electrodes and packaging are applied. These processes may be carried out according to techniques well known in the art; however, the metalization need not be carried out—as was heretofore necessary—under the ultraclean conditions. Fluxes can be used for soldering, and less expensive non-"transistor grade" chemicals can be used for cleaning. In addition, since these devices are relatively insensitive to ambient conditions, nonhermetic packaging, such as plastic packaging, can be conveniently utilized. FIG. 3C shows the metalized circuit complete except for packaging. Switch contacts 37 and 38, source and drain electrodes 39 and 40 are shown in contact with the source 31 and drain 32, respectively; and the gate electrode 41 is shown disposed upon gate insulator 42 above channel region 33. The switch can be conveniently connected with switch or memory utilization means in accordance with the circuit designer's needs through contacts 37 and 38.

While the invention has been described in connection with a small number of specific embodiments, it is to be understood that these embodiments are merely illustrative of the many possible specific embodiments which can represent applications of the principles of the invention. As is well known, switching and memory devices are among the basic building blocks in the fabrication of innumerable circuits of immense practical significance. By providing a glass switch which is readily incorporated into integrated circuits, applicant renders possible numerous and varied devices which can be made by those skilled in the art without departing from the spirit and scope of the invention.

I claim:

1. A glass electronic switching device comprising a layer of glass disposed between a pair of electrodes, said device characterized in that said layer of glass is a homogeneous layer of an insulating glass having a specific resistivity in excess of about $10^{12}$ ohm cm. and in that said layer has a thickness of less than about 5 microns.

2. A device according to claim 1 wherein said insulating glass is an ionically impermeable glass comprised of 50 mole per cent or more of one or more phases selected from the group consisting of $PbSiO_3$, $Pb_6Al_2Si_6O_{21}$, $ZnB_2O_4$, and $Zn_2SiO_4$.

3. A device according to claim 1 wherein said insulating glass is an ionically impermeable glass comprised of 70 mole per cent or more of one or more phases selected from the group consisting of $PbSiO_3$, $Pb_6Al_2Si_6O_{21}$, $ZnB_2O_4$, and $Zn_2SiO_4$.

4. A device according to claim 1 wherein said glass is predominantly comprised of one or more phases selected from the group consisting of $PbSiO_3$, $Pb_6Al_2Si_6O_{21}$, $ZnB_2O_4$, and $Zn_2SiO_4$.

5. A device according to claim 1 additionally characterized in that said glass layer is less than 2 microns thick.

6. A device according to claim 1 additionally characterized in that said glass layer is less than 1 micron thick.

7. A device according to claim 1 additionally characterized in that one of said electrodes is a doped crystalline semiconductor.

8. A glass switching device according to claim 1 comprising a layer of glass disposed between a pair of electrodes, said device characterized in that said glass is made from the following components in the following mole percentage ranges:

$SiO_2$ — 3–12 — mole per cent
ZnO — 45–65 — mole per cent
PbO — 0–6 — mole per cent
$B_2O_3$ — 25–40 — mole per cent
$Al_2O_3$ — 0–3 — mole per cent wherein calcium oxide, barium oxide, or strontium oxide or a mixture thereof can be substituted for ZnO in an amount up to 10 mole per cent.

9. A glass switching device according to claim 1 comprising a layer of glass disposed between a pair of electrodes, said device characterized in that said glass is made from the following components in the following mole percentage ranges:

$SiO_2$ — 55–65 — mole per cent
PbO — 30–40 — mole per cent
$Al_2O_3$ — 0–7 — mole per cent wherein $B_2O_3$, $V_2O_5$, or $P_2O_5$ or a mixture thereof can be substituted for $SiO_2$ and ZnO can be substituted for PbO, each substitution limited to 20 mole per cent.

10. A glass switching device according to claim 1 comprising a layer of glass disposed between a pair of electrodes, said device characterized in that said glass is made from the following components in the following mole percentage ranges:

$SiO_2$ — 35–55 — mole per cent
PbO — 35–60 — mole per cent
$Al_2O_3$ — 0–20 — mole per cent wherein $B_2O_3$, $V_2O_5$, or $P_2O_5$ or a mixture thereof can be substituted for $SiO_2$ and ZnO can be substituted for PbO, each substitution limited to 20 mole per cent.

11. A glass switching device according to claim 1 comprising a layer of glass disposed between a pair of electrodes, said device characterized in that said glass is made from the following components in the following mole percentage ranges:

$SiO_2$ — 5–15 — mole per cent
ZnO — 50–65 — mole per cent
$B_2O_3$ — 25–35 — mole per cent wherein calcium oxide, barium oxide, strontium oxide or a mixture thereof can be substituted for ZnO in amounts up to 10 mole per cent, and PbO can be substituted for ZnO in amounts up to 20 mole per cent.

* * * * *